US010655879B2

(12) United States Patent
Muramatsu

(10) Patent No.: US 10,655,879 B2
(45) Date of Patent: May 19, 2020

(54) AIR-CONDITIONING SYSTEM, AIR-CONDITIONING CONTROL METHOD, AND NON-TRANSITORY COMPUTER READABLE MEDIUM STORING PROGRAM

(71) Applicant: Mitsubishi Electric Corporation, Tokyo (JP)

(72) Inventor: Hidenori Muramatsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/082,301

(22) PCT Filed: Apr. 19, 2016

(86) PCT No.: PCT/JP2016/062344
§ 371 (c)(1),
(2) Date: Sep. 5, 2018

(87) PCT Pub. No.: WO2017/183103
PCT Pub. Date: Oct. 26, 2017

(65) Prior Publication Data
US 2019/0212027 A1 Jul. 11, 2019

(51) Int. Cl.
*F24F 11/46* (2018.01)
*H05K 7/20* (2006.01)
(Continued)

(52) U.S. Cl.
CPC ............. *F24F 11/46* (2018.01); *F24F 11/64* (2018.01); *F24F 11/89* (2018.01); *H05K 7/207* (2013.01);
(Continued)

(58) Field of Classification Search
None
See application file for complete search history.

(56) References Cited

U.S. PATENT DOCUMENTS 4,756,473 A * 7/1988 Takemae ................. G05D 23/19
236/1 EA
6,932,696 B2 * 8/2005 Schwartz .................. G06F 1/20
361/695
(Continued)

FOREIGN PATENT DOCUMENTS

EP 3 098 533 A1 11/2016
JP 2006-064254 A 3/2006
(Continued)

OTHER PUBLICATIONS

International Search Report ("ISR") dated Jun. 14, 2016 issued in corresponding International patent application No. PCT/JP2016/062344 (and English translation).
(Continued)

*Primary Examiner* — Sean Shechtman
(74) *Attorney, Agent, or Firm* — Posz Law Group, PLC

(57) ABSTRACT

An air-conditioning system according to the present invention includes plural air-conditioning apparatuses which air-condition the same space, and a controller which includes a communication unit, a data collection unit and a determination unit. The communication unit communicates with the plural air-conditioning apparatuses via a communication line. The data collection unit collects air-conditioning data including information indicating an air-conditioning efficiency from each of the plural air-conditioning apparatus via the communication unit. The determination unit determines one of the air-conditioning apparatuses which has the lowest air-conditioning efficiency, as a low-efficiency air-conditioning apparatus, based on the collected air-conditioning data, reduces the load on the low-efficiency air-conditioning apparatus, and causes one or ones of the plural air-conditioning apparatuses which are other than the low-efficiency air-conditioning apparatus, to bear an amount of load by which
(Continued)

the load on the low-efficiency air-conditioning apparatus is reduced.

12 Claims, 3 Drawing Sheets

(51) Int. Cl.
    *F24F 11/89*     (2018.01)
    *F24F 11/64*     (2018.01)
    *F24F 140/60*     (2018.01)
    *F24F 110/10*     (2018.01)

(52) U.S. Cl.
    CPC ..... H05K 7/20209 (2013.01); H05K 7/20836 (2013.01); *F24F 2110/10* (2018.01); *F24F 2140/60* (2018.01); *Y02D 10/16* (2018.01)

(56) References Cited

U.S. PATENT DOCUMENTS

| | | | |
|---|---|---|---|
| 7,472,558 B1* | 1/2009 | Narita | F24F 11/30 62/175 |
| 2006/0161307 A1* | 7/2006 | Patel | H05K 7/20745 700/277 |
| 2011/0093121 A1* | 4/2011 | Wakuta | F24F 11/30 700/276 |
| 2011/0257794 A1* | 10/2011 | Nishino | F24F 11/30 700/277 |
| 2013/0096721 A1* | 4/2013 | Iyengar | H05K 7/20836 700/276 |
| 2013/0098084 A1 | 4/2013 | Matsuo et al. | |
| 2014/0316583 A1* | 10/2014 | Ambriz | F24F 11/30 700/277 |

FOREIGN PATENT DOCUMENTS

| | | |
|---|---|---|
| JP | 2012-037141 A | 2/2012 |
| JP | 2015-141014 A | 8/2015 |

OTHER PUBLICATIONS

Office Action dated Apr. 9, 2019 issued in corresponding JP patent application No. 2018-512677 (and English translation).

* cited by examiner

| AIR-CONDITIONING APPARATUS | AIR-CONDITIONING EFFICIENCY | STATE BEFORE CHANGE OF TARGET TEMPERATURE | | STATE AFTER CHANGE OF TARGET TEMPERATURE | |
|---|---|---|---|---|---|
| | | POWER CONSUMPTION [kW] | COOLING CAPACITY [kW] | POWER CONSUMPTION [kW] | COOLING CAPACITY [kW] |
| AIR-CONDITIONING APPARATUS A1 | LOW | 15 | Q | 12 | 0.8Q |
| AIR-CONDITIONING APPARATUS A2 | INTERMEDIATE | 12 | Q | 12 | Q |
| AIR-CONDITIONING APPARATUS A3 | HIGH | 10 | Q | 12 | 1.2Q |
| TOTAL | | 37 | 3Q | 36 | 3Q |

AIR-CONDITIONING SYSTEM, AIR-CONDITIONING CONTROL METHOD, AND NON-TRANSITORY COMPUTER READABLE MEDIUM STORING PROGRAM

CROSS REFERENCE TO RELATED APPLICATION

This application is a U.S. national stage application of PCT/JP2016/062344 filed on Apr. 19, 2016, the contents of which are incorporated herein by reference.

TECHNICAL FIELD

The present invention relates to an air-conditioning system including plural air-conditioning apparatuses, an air-conditioning control method and a program for causing a computer to processes.

BACKGROUND ART

Of air-conditioning systems, air-conditioning systems are present which are made up of an air-conditioning apparatus which includes an indoor unit and an outdoor unit, and a controller which collects operation information on the air-conditioning apparatus from the air-conditioning apparatus through communication. In some cases, the controller is capable of controlling the plural air-conditioning apparatuses. Such a controller is connected to the plural air-conditioning apparatuses such that it can communicate therewith, and collects operation information on each of the air-conditioning apparatuses from each air-conditioning apparatus.

In a computer room or a similar space, a large number of servers are installed. In order to remove heat generated from those servers, and keep the temperature of the room at a constant level, the above air-conditioning system including the plural air-conditioning apparatuses is provided in the computer room. In order to keep the temperature of the computer room at a constant level, the controller controls the operations of the plural air-conditioning apparatuses.

If a further server or servers is added to the computer room, an air-conditioning apparatus or apparatuses are also added in accordance with the number of added servers. In the case where the computer room has been operated for many years, there is a case where an air-conditioning apparatus having been operated for ten and several years and a latest air-conditioning apparatus coexist in the room. Because of a technical progress of air-conditioning apparatuses, in general, the latest model of air-conditioning apparatuses have a higher coefficient of performance (COP) than those of old models of air-conditioning apparatuses. In the case where an air-conditioning system including air-conditioning apparatuses having different COPs performs control to keep the temperature of a computer room at a constant level, an air-conditioning apparatus having a lower COP consumes a larger amount of power than an air-conditioning apparatus having a higher COP, though the loads on the air-conditioning apparatuses are equivalent to each other.

Patent literature 1 discloses an example of an air-conditioning system including plural outdoor units having different COPs. To be more specific, patent literature 1 discloses the following technique: with respect to three outdoor units, an operation-capability distribution table for determining priorities for operating them based on the COP characteristics, maximum COPs and capacities of them is prepared in advance, and in accordance with a required load, based on the operation-capability distribution table, the load is distributed to two outdoor units having higher priorities, and the operation of the remaining outdoor unit is made in a stopped state. In such a manner, an outdoor unit or units having a higher priority are started, to thereby achieve a high efficient operation.

CITATION LIST

Patent Literature

Patent Literature 1: Japanese Unexamined Patent Application Publication No. 2015-141014 (claim 13)

SUMMARY OF INVENTION

Technical Problem

In the air-conditioning system disclosed in patent literature 1, an outdoor unit having a higher COP is preferentially started in accordance with a varying heat load, and as a result there is a case where an outdoor unit having a lower COP is not started. Therefore, the outdoor unit having the higher COP tends to be operated for a longer time period than another or other outdoor units. It is therefore necessary to take countermeasures for preventing the load on the outdoor unit having the higher COP from being extremely greater than that on the other outdoor unit or units.

In the method disclosed in patent literature 1, there is a case where an outdoor unit is not started, although whether it is stated or not depends on a heat load. Therefore, the method of patent literature 1 cannot be applied to a system for operating all air-conditioning apparatuses which air-conditions the same space. Also, in the method of patent literature 1, the operation-capability distribution table needs to be modified each time an air-conditioning apparatus is added.

The present invention has been made to solve the above problems, and is to obtain an air-conditioning system, an air-conditioning control method and a program for causing a computer to perform processes, which can all improve the air-conditioning efficiency of the entire system in which air-conditioning apparatuses having different air-conditioning efficiencies coexist.

Solution to Problem

According to one embodiment of the present invention, there is provided an air-conditioning system including plural air-conditioning apparatuses which air-condition the same space; and a controller which includes a communication unit, a data collection unit and a determination unit. The communication unit communicates with the plural air-conditioning apparatuses via a communication line. The data collection unit collects air-conditioning data including information indicating an air-conditioning efficiency from each of the plural air-conditioning apparatuses via the communication unit. The determination unit determines one of the plural air-conditioning apparatuses which has the lowest air-conditioning efficiency, based on the collected air-conditioning data, as a low-efficiency air-conditioning apparatus, reduces the load on the low-efficiency air-conditioning apparatus, and causes one or ones of the plural air-conditioning apparatuses which are other than the low-efficiency air-conditioning apparatus, to bear an amount of load by which the load on the low-efficiency conditioning apparatus is reduced.

According to one embodiment of the present invention, there is provided a method of air-conditioning control, which is executed by a controller configured to control plural air-conditioning apparatuses configured to air-condition the same space, the method including: collecting air-conditioning data including information indicating an air-conditioning efficiency from each of the plural air-conditioning apparatuses via a communication line; determining one of the plural air-conditioning apparatuses based on the collected air-conditioning data; reducing the load on the low-efficiency air-conditioning apparatus, and causing one or ones of the air-conditioning apparatuses which are other than the low-efficiency air-conditioning apparatus to bear an amount of load by which the load on the low-efficiency air-conditioning apparatus is reduced.

According to one embodiment of the present invention, there is provided a program for causing a computer configured to control plural air-conditioning apparatuses configured to air-condition the same space to execute the processes of: collecting air-conditioning data including information representing air-conditioning efficiency from each of the plurality of air-conditioning apparatus via a communication line; determining one of the air-conditioning apparatuses which has the lowest air-conditioning efficiency, as a low-efficiency air-conditioning apparatus, based on the collected air-conditioning data; reducing the load on the low-efficiency air-conditioning apparatus, and causing one or ones of the plural air-conditioning apparatuses which are other than the low-efficiency air-conditioning apparatus to bear an amount of load by which the load on the low-efficiency air-conditioning apparatus is reduced.

Advantageous Effects of Invention

According to one embodiment of the present invention, in the case where plural air-conditioning apparatuses are operated to air-condition the same space, the load on one of the plural air-conditioning apparatuses which has the lowest air-conditioning efficiency is reduced, and an amount of load by which the load is reduced is automatically compensated for another one of the plural air-conditioning apparatuses. By virtue of the above, the load on an air-conditioning apparatus having a high air-conditioning efficiency is high, and the air-conditioning efficiency of the entire system can be improved.

DESCRIPTION OF EMBODIMENTS

Embodiment 1

(Outline of Air-Conditioning System)

A configuration of an air-conditioning system according to embodiment 1 will be described.

Figure 1:
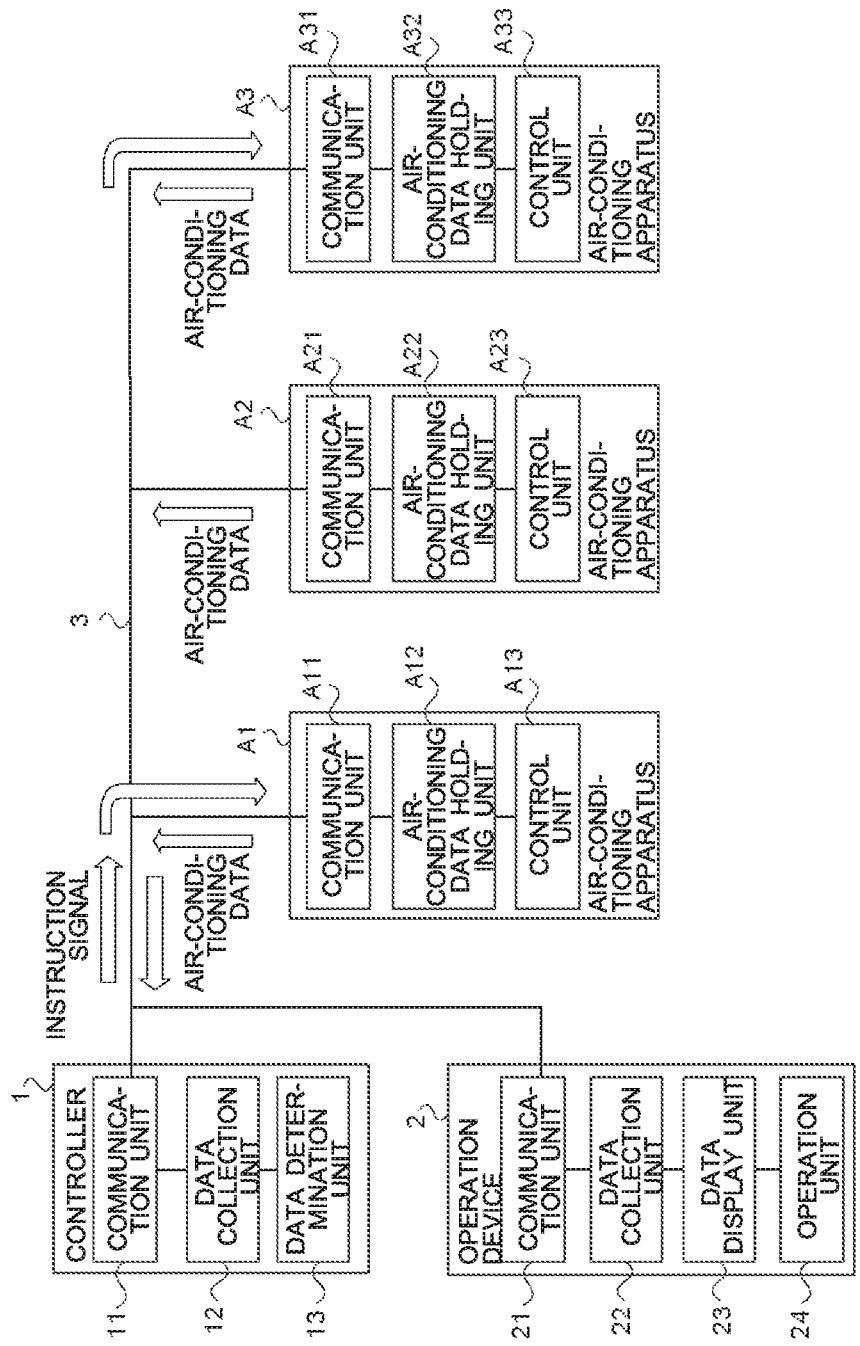
FIG. 1 is a block diagram for illustrating an air-conditioning system according to embodiment 1 of the present invention.

FIG. 1 is a block diagram illustrating the air-conditioning system according to embodiment 1 of the present invention.

As illustrated in FIG. 1, the air-conditioning system includes air-conditioning apparatuses A1 to A3, a controller 1 which controls operations of the air-conditioning apparatuses A1 to A3, and an operation device 2 which allows an administrator to input an instruction to the air-conditioning apparatuses A1 to A3. The air-conditioning apparatus A1 to A3, the controller 1 and the operation device 2 are connected to each other via a communication line 3 such that they can communicate with each other.

The air-conditioning system as illustrated in FIG. 1 is provided on the supposition that the air-conditioning apparatuses A1 to A3 air-condition the same space which is a server room in which plural servers are installed. Therefore, in the space to be air-conditioned by the air-conditioning apparatuses A1 to A3, a heat load hardly greatly changes, and is stable.

(Configuration of Controller 1)

The controller 1 collects air-conditioning data on the air-conditioning apparatuses A1 to A3, and instructs each of the air-conditioning apparatuses A1 to A3 to change a target temperature set value.

The controller 1 includes a communication unit 11 which communicates with the air-conditioning apparatuses A1 to A3, a data collection unit 12 which collects air-conditioning data from the air-conditioning apparatuses A1 to A3 and stores the air-conditioning data, and a data determination unit 13 which determines whether or not to make a change with respect to the operation state of each of the air-conditioning apparatuses A1 to A3, based on the collected air-conditioning data.

The controller 1 includes a memory (not shown) which stores a program, and a central processing unit (CPU) (not shown) which executes processing in accordance with the program. The memory (not shown) is, for example, a nonvolatile memory including a flash memory. The CPU (not shown) executes the program, whereby the data collection unit 12 and the data determination unit 13 are provided in the controller 1. The data collection unit 12 and the data determination unit 13 may be provided as a microcomputer.

The air-conditioning data includes a rated COP as information indicating an air-conditioning efficiency. In general, the COP is expressed by COP=(cooling capacity or heating capacity [kilowatt]/power consumption [kilowatt]). The rated COP corresponds to a COP at the time of performing the operation under a rated condition. The air-conditioning data may include information on the operation state, which includes the target temperature set value in addition to the rated COP.

The communication unit 11 acquires the air-conditioning data held by the air-conditioning apparatuses A1 to A3 therefrom via the communication line 3.

The data determination unit 13 determines an air-conditioning apparatus having a high rated COP and an air-conditioning apparatus having a low rated COP based on the air-conditioning data collected from the air-conditioning apparatuses A1 to A3. Then, in order to increase the load on the air-conditioning apparatus having a high rated COP, if a cooling operation is performed, the data determination unit 13 instructs the air-conditioning apparatus having the high rated COP to lower the target temperature set value thereof by a predetermined value, and instructs the air-conditioning apparatus having the low rated COP to raise the target temperature set value thereof in accordance with the above lowered value. By contrast, if a heating operation is performed, the data determination unit 13 instructs the air-conditioning apparatus having the high rated COP to raise the target temperature set value thereof by a predetermined value, and instructs the air-conditioning apparatus having the low rated COP thereof to lower the target temperature set value in accordance with the above raised value.

(Configuration of Operation Device 2)

The operation device 2 is a device which displays for the administrator, the air-conditioning data collected from the air-conditioning apparatuses A1 to A3, and allow the administrator to input instructions to, for example, start or stop the operation and change the target temperature set value to the air-conditioning apparatuses A1 to A3.

The operation device 2 includes a communication unit 21 which communicates with the air-conditioning apparatuses A1 to A3, a data collection unit 22 which collects air-conditioning data from the air-conditioning apparatuses A1 to A3 and store the air-conditioning data, a data display unit 23 which displays contents of the collected air-conditioning data, and an operation unit 24 which inputs setting values for the operations of the air-conditioning apparatuses A1 to A3.

The data display unit 23 receives the air-conditioning data on the air-conditioning apparatuses A1 to A3 from the data collection unit 22, and displays the values of the rated COPs of the air-conditioning apparatuses and information indicating the operation state such as the target temperature set value.

(Configurations of Air-Conditioning Apparatuses A1 to A3)

The configuration of the air-conditioning apparatus A1 as illustrated in FIG. 1 will be described.

The air-conditioning apparatus A1 includes a communication unit A11 which communicates with the controller 1 and the operation device 2, an air-conditioning data holding unit A12 which holds air-conditioning data including the rated COP of the own apparatus and information on the target temperature set value, and a control unit A13. The air-conditioning data holding unit A12 is, for example, a nonvolatile memory. The control unit A13 is a microcomputer.

When receiving the target temperature set value from the controller 1 or the operation device 2 via the communication line 3, the communication unit A11 stores the target temperature set value in the air-conditioning data holding unit A12.

The communication unit A11 transmits the air-conditioning data held by the air-conditioning data holding unit A12 to the controller 1 and the operation device 2 via the communication line 3 in response to requests from the controller 1 and the operation device 2.

The control unit A13 refers to the target temperature set value held by the air-conditioning data holding unit A12, and controls a configuration including a compressor (not shown) and a fan (not shown) which supplies outside air to a heat exchanger (not shown) of an outdoor unit (not shown) such that the temperature of the room reaches the target temperature set value.

The control unit A13 monitors the operation state of the air-conditioning apparatus A1, and stores information on the operation state in the air-conditioning data holding unit A12.

The configurations of the air-conditioning apparatus A2 and A3 as illustrated in FIG. 1 will be described.

The air-conditioning apparatus A2 includes a communication unit A21, an air-conditioning data holding unit A22 and a control unit A23. The air-conditioning apparatus A3 includes a communication unit A31, an air-conditioning data holding unit A32 and a control unit A33. The communication units A21 and A31 have the same configuration as the communication unit A11. The air-conditioning data holding units A22 and A32 have the same configuration as the air-conditioning data holding unit A12. The control units A23 and A33 have the same configuration as the control unit A13. Therefore, detailed descriptions of the configurations of the air-conditioning apparatus A2 and A3 will be omitted.

However, it should be noted that each of the air-conditioning apparatuses A1 to A3 was installed in the server room at time different from times at which the other ones of the air-conditioning apparatuses A1 to A3 were installed in the server room, and the later the air-conditioning apparatus was installed, the higher the air-conditioning efficiency thereof. For example, it is assumed that the air-conditioning apparatus A1 was installed in 2001, the air-conditioning apparatus A2 was installed in 2007, and the air-conditioning apparatus A3 was installed in 2015. Therefore, in this case, the air-conditioning efficiency of the air-conditioning apparatus A3 is the highest (high efficiency), the air-conditioning efficiency of the air-conditioning apparatus A1 is the lowest (low efficiency), and the air-conditioning efficiency of the air-conditioning apparatus A2 is intermediate (intermediate efficiency) between those of the air-conditioning apparatuses A1 and A3. The values of the rated COPs of the air-conditioning apparatuses A1 to A3 satisfy the relationship "A1<A2<A3".

(Method of Performing Air-Conditioning Control with Controller 1 in Embodiment 1)

Next, it will be explained how the controller 1 in the air-conditioning system according to embodiment 1 is operated.

In such an air-conditioning system for cooling servers as illustrated in FIG. 1, an air-conditioning apparatus is additionally installed each time a server is additionally installed. Therefore, plural air-conditioning apparatuses which cool the same room are different from each other in time when they were installed. Air-conditioning apparatuses have been developed and their air-conditioning efficiencies have been improved year by year, and with respect to the rated COP of air-conditioning apparatuses installed, the rated COP tends to gradually decrease from that of the air-conditioning apparatus installed latest. As described above, the rated COPs of the air-conditioning apparatuses A1 to A3 have the relationship of A1<A2<A3.

Figures 2, 3:
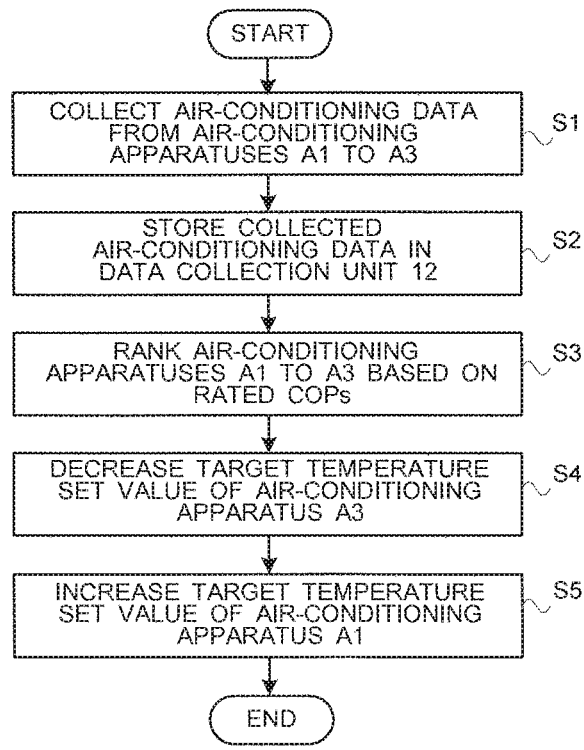
FIG. 2 is a flow chart of the procedure for an operation to be performed by a controller as illustrated in FIG. 1, in embodiment 1 of the present invention.
FIG. 3 is a table for explaining advantages of an air-conditioning control method according to embodiment 1 of the present invention.

FIG. 2 is a flowchart of the procedure for the operation to be performed by the controller as illustrated in FIG. 1 in embodiment 1 of the present invention. FIG. 3 is a table for illustrating advantages of an air-conditioning control method according to embodiment 1 of the present invention. It is assumed that the air-conditioning apparatuses A1 to A3 are performing a cooling operation.

The communication unit 11 collects air-conditioning data from each of the air-conditioning apparatuses A1 to A3 (step S1), and stores the collected air-conditioning data in the data collection unit 12 (step S2).

The data determination unit 13 reads out the air-conditioning data held by the data collection unit 12, compares the values of rated COPs of the air-conditioning data with each other, and ranks the air-conditioning apparatuses A1 to A3 based on the rated COPs with respect to the air-conditioning efficiency (step S3). In this example, the data determination unit 13 determines that the rated COPs of the air-conditioning apparatuses A1 to A3 satisfy A1<A2<A3. The air-conditioning apparatus A1 is a low-efficiency air-conditioning apparatus, which is an air-conditioning apparatus having the lowest air-conditioning efficiency. The air-conditioning apparatus A3 is a high-efficiency air-conditioning apparatus, which is an air-conditioning apparatus having the highest air-conditioning efficiency.

Air-conditioning control to be executed by the data collection unit 12 will be described with reference to FIG. 3.

In general, in the case where plural air-conditioning apparatuses set the same room as a target room to be air-conditioned, the target temperature set values of those plural air-conditioning apparatuses are set to the same value. However, in the air-conditioning system as illustrated in FIG. 1, in the case where the air-conditioning apparatuses A1 to A3 continue to operate with the same target temperature set values, the air-conditioning apparatus A1 having low air-conditioning efficiency and the air-conditioning apparatus A3 having high air-conditioning efficiency continue to operate with the same load (cooling capacity). This is indicated in the "STATE BEFORE CHANGE OF TARGET TEMPERATURE" in the table of FIG. 3.

However, from the viewpoint of the entire air-conditioning system as illustrated in FIG. 1, it is considered possible to reduce the power consumption of the entire air-conditioning system while maintaining a required cooling capacity, by increasing the load on the air-conditioning apparatus A3 having high air-conditioning efficiency, which can process with less power consumption, the same load as the other air-conditioning apparatuses, and reducing the load on the air-conditioning apparatus A1 having low air-conditioning efficiency. This is indicated in the "STATE AFTER CHANGE OF TARGET TEMPERATURE" in the table of FIG. 3.

Referring back to step S3 as illustrated in FIG. 2, after the data determination unit 13 determines that the air-conditioning efficiency satisfy A1<A2<A3, in order to increase the load on the air-conditioning apparatus A3 having the highest air-conditioning efficiency, the data determination unit 13 sends an instruction signal including an instruction to lower the target temperature set value by 1 (degree C.) to the air-conditioning apparatus A3 (step S4). Furthermore, in order to decrease the load on the air-conditioning apparatus A1 having the lowest air-conditioning efficiency, the data determination unit 13 sends an instruction signal including an instruction to raise the target temperature set value by 1 (degree C.) to the air-conditioning apparatus A1 (step S5).

The communication unit A11 of the air-conditioning apparatus A1 stores the received instruction signal in the air-conditioning data holding unit A12. The air-conditioning data holding unit A12 changes the held target temperature set value in response to the instruction signal received from the communication unit A11. The control unit A13 changes the operation states of the compressor (not shown), the fan (not shown), etc., in accordance with the change of the target temperature set value held by the air-conditioning data holding unit A12.

The communication unit A31 of the air-conditioning apparatus A3 stores the received instruction signal in the air-conditioning data holding unit A32. The air-conditioning data holding unit A32 changes the held target temperature set value in response to the instruction signal received from the communication unit A31. The control unit A33 changes the operation states of the compressor (not shown), the fan (not shown), etc., in accordance with the change of the target temperature set value held by the air-conditioning data holding unit A32.

Referring to FIG. 3, in the case where a cooling capacity of 3Q (kilowatt) is required for the entire system, the target temperature set value of the air-conditioning apparatus A1 is raised by 1 (degree C.), to thereby decrease the load (cooling capacity) by 20 percent. By contrast, the target temperature setting value of the air-conditioning apparatus A3 is decreased by 1 (degree C.), to thereby increase the load (cooling capacity) by 20 percent. As a result, as indicated in the bottom row of the table shown in FIG. 3, in the entire system, it is possible to reduce the power consumption by 1 (kilowatt) while maintaining the cooling capacity of 3Q (kilowatt).

In such a manner, the air-conditioning apparatus A3 having high air-conditioning efficiency is operated, with the load set higher than those of the air-conditioning apparatus A1 and A2, and the air-conditioning apparatus A1 having low air-conditioning efficiency is operated, with the load set lower than those of the air-conditioning apparatus A2 and A3. It is therefore possible to achieve air-conditioning with a higher efficiency as the entire air-conditioning system.

Embodiment 1 is explained above by referring to the case where the air-conditioning system includes three air-conditioning apparatus; however, the number of air-conditioning apparatus is not limited to three, that is, it may be two, or may be four or more.

Also, embodiment 1 is explained above by referring to the case where the air-conditioning apparatus A3 having a high rated COP is caused to bear an amount of load by which the load on the air-conditioning apparatus A1 having a low rated COP is reduced. However, not only the air-conditioning apparatus A3 but the air-conditioning apparatus A2 may be caused to bear the amount of load by which the load on the air-conditioning apparatus A1 is reduced. For example, it is conceivable that there is a case where even when the rated COPs of the air-conditioning apparatus A2 and A3 satisfy the relationship "A2<A3", the difference therebetween is small. In this case, when the target temperature set value of the air-conditioning apparatus A1 is raised by 1 (degree C.), the target temperature set value of each of the air-conditioning apparatus A2 and A3 may be lowered by 0.5 (degree C.).

Furthermore, in embodiment 1, all the air-conditioning apparatus connected to the controller 1 are ranked in air-conditioning efficiency; however, in the case where plural air-conditioning apparatuses are connected to the controller 1, it may be set that the air-conditioning apparatuses may be divided into a plurality of groups, priorities are assigned to the plurality of groups, and of these groups, a group having the highest priority is caused to perform the air-conditioning control according to embodiment 1.

In addition, in embodiment 1, the rated COP is applied as the information indicating the air-conditioning efficiency; however, the value of the COP is not limited to the rated COP. Also, the COPs may be measured by the air-conditioning apparatuses A1 to A3, respectively. For example, it may be set that sensors for measuring the pressure and temperature of refrigerant are provided in advance at a refrigerant inlet and a refrigerant outlet of a compressor (not shown) of each of the air-conditioning apparatuses, and a wattmeter is provided in advance at the compressor (not shown); the control unit obtains the cooling capacity based on the values measured by those sensors, and the value of the obtained cooling capacity is divided by the value of the power consumption of the compressor (not shown), to thereby calculate the COP. In this measurement, the administrator may make the setting such that for a certain time period, an air-conditioning apparatus or apparatuses other than an air-conditioning apparatus to be measured is caused to maintain its or their operation states even if the temperature of the room varies, and the air-conditioning apparatus to be measured is caused to automatically operate.

The air-conditioning system according to embodiment 1 includes the plural air-conditioning apparatuses A1 to A3 which air-condition the same space, and the controller 1 including the communication unit 11, the data collection unit 12 and the data determination unit 13, the communication unit 11 being provided to communicate with the plural air-conditioning apparatus A1 to A3 via the communication line 3, the data collection unit 12 being provided to collect the air-conditioning data including the information indicating the air-conditioning efficiency from each of the air-conditioning apparatuses A1 to A3 via the communication unit 11, the data determination unit 13 being provided to determine as a low-efficiency air-conditioning apparatus, one of the air-conditioning apparatuses A1 to A3 which has the lowest air-conditioning efficiency, based on the collected air-conditioning data, reduce the load on the low-efficiency air-conditioning apparatus, and cause one or ones of the air-conditioning apparatuses which are other than the low-efficiency air-conditioning apparatus to bear an amount of load by which the load on the low-efficiency air-conditioning apparatus is reduced.

According to embodiment 1, in the case where plural air-conditioning apparatuses are operated to air-condition the same space, the load on one of the air-conditioning apparatuses which has the lowest air-conditioning efficiency is reduced, and another one of the air-conditioning apparatuses automatically compensates for an amount of load by which the above load is reduced. By virtue of this, the load on an air-conditioning apparatus having high air-conditioning efficiency is increased, and the air-conditioning efficiency of the entire air-conditioning system can be improved. As a result, energy saving can be achieved.

In embodiment 1, it may be set that the COP is applied as the information indicating the air-conditioning efficiency, and the data determination unit 13 refers to the air-conditioning data on each of the plural air-conditioning apparatus A1 to A3, and determines the air-conditioning apparatus A1 having the smallest value of the COP as the low-efficiency air-conditioning apparatus, and the air-conditioning apparatus A3 having the greatest value of the COP as the high-efficiency air-conditioning apparatus, to thereby cause the high-efficiency air-conditioning apparatus to bear the above amount of load by which the load on the low-efficiency air-conditioning apparatus is reduced.

In the above case, based on the COP collected from the air-conditioning apparatuses A1 to A3, the data determination unit 13 causes the air-conditioning apparatus A3 having the highest air-conditioning efficiency to operate with a high load, and the air-conditioning apparatus A1 having the lowest air-conditioning efficiency to operate with a low load. It is therefore possible to perform air-conditioning with a higher efficiency as the entire air-conditioning system.

In embodiment 1, the data determination unit 13 may send an instruction signal including information regarding changing of the target temperature set value, which is made in accordance with the amount of load by which the load on the low-efficiency air-conditioning apparatus is reduced, to the low-efficiency air-conditioning apparatus via the communication unit 11 and the communication line 3.

In this case, in order to reduce the load on the low-efficiency air-conditioning apparatus, the data determination unit 13 explicitly instructs the low-efficiency air-conditioning apparatus to change the target temperature set value, to thereby reduce the load on the low-efficiency air-conditioning apparatus; however, it is possible to reliably improve the efficiency of the entire air-conditioning system by causing the above amount of load to be automatically compensated for by another indoor unit.

Embodiment 2

Embodiment 2 is to improve an air-conditioning efficiency of an air-conditioning system by reducing the load on an air-conditioning apparatus using a component which is related to air-conditioning operation, and which deteriorates in function, since the air-conditioning efficiency is affected by deterioration of the above component.

The configuration of the air-conditioning system according to embodiment 2 will be described with reference to FIG. 1. In the following, detailed descriptions of configurations which are the same as those of the air-conditioning system according to embodiment 1 which are described above will be omitted.

(Configurations of Air-Conditioning Apparatuses A1 to A3)

An example of configurations of the air-conditioning apparatuses A1 to A3 as illustrated in FIG. 1 will be described with reference to FIG. 4.

Figure 4:
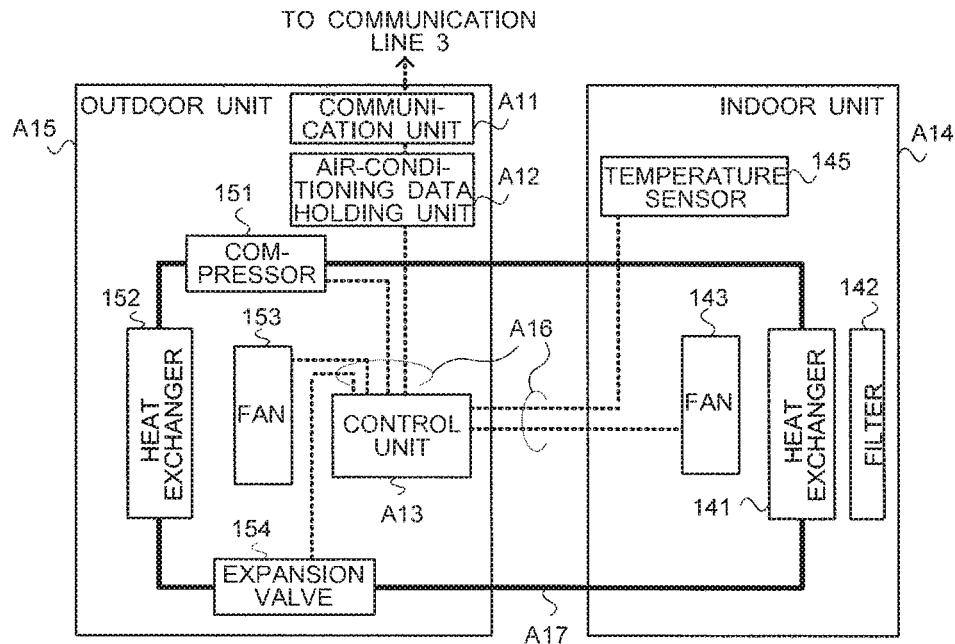
FIG. 4 is a block diagram illustrating an example of the configuration of the air-conditioning apparatus as illustrated in FIG. 1, which is applied in an air-conditioning system according to embodiment 2 of the present invention.

FIG. 4 is a block diagram illustrating an example of the configuration of the air-conditioning apparatus as illustrated in FIG. 1, which is applied in the air-conditioning system according to embodiment 2 of the present invention. In the following description, the configuration of the air-conditioning apparatus A1 is described.

As illustrated in FIG. 4, the air-conditioning apparatus A1 includes an indoor unit A14 and an outdoor unit A15.

The indoor unit A14 includes a heat exchanger 141, a filter 142 provided close to air intake of the heat exchanger 141, a fan 143 and a temperature sensor 145 which measures the temperature of a room.

The outdoor unit A15 includes a compressor 151, a heat exchanger 152, a fan 153, an expansion valve 154, a control unit A13, an air-conditioning data holding unit A12 and a communication unit A11.

The control unit A13 is connected to the fans 143 and 153, the expansion valve 154, the compressor 151, the temperature sensor 145 and the air-conditioning data holding unit A12 by a signal line A16.

The heat exchangers 141 and 152, the compressor 151 and the expansion valve 154 are connected by a refrigerant pipe A17.

FIG. 4 illustrates the example of the configuration in the case where the air-conditioning apparatus performs a cooling operation; however, an air-conditioning apparatus may be used in which a four-way switching valve is provided in advance in the refrigerant pipe A17 to enable the air-conditioning apparatus to perform both a cooling operation and a heating operation. Also, FIG. 4 illustrates the case in which the control unit A13, the air-conditioning data holding unit A12 and the communication unit A11 are provided in the outdoor unit A15; however, these units may be provided in the indoor unit A14. In addition, an optical sensor which detects dirt at the filter 142 may be provided at the filter 142.

In embodiment 2, the air-conditioning data includes information on use states of components related to the air-conditioning operation. For example, these components are the heat exchangers 141 and 152, the compressor 151, the expansion valve 154, and the filter 142. The components are also components each of which may affect the air-conditioning efficiency if the function of each component deteriorates.

The control unit A13 monitors the use states of the components related to the air-conditioning operation, and stores information indicating the use states in the air-conditioning data holding unit A12. It is considered that the functions of the components will deteriorate as a result of operating the air-conditioning apparatus for long time. In this regard, for example, if the compressor 151 is a component to be monitored, the above use state thereof is indicated as a time period for which the compressor is operated from the time when the compressor 151 started to be used or from the time when the compressor 151 was lastly maintained to the present time. If any of the heat exchangers 141 and 152, the expansion valve 154 and the filter 142 is the component to be monitored, the above use state thereof is also indicated as a time period for which it is operated from the time when it started to be used or from the time when it was lastly maintained to the present time. The control unit A13 updates information on the operation state of each of the components in accordance with the operation of the air-conditioning apparatus A1.

(Configuration of Controller 1)

Next, the configuration of the controller 1 in embodiment 2 will be described.

The data determination unit 13 holds as a threshold value or values a maintenance cycle period and a component replacement cycle period in advance with respect to each of the components related to the air-conditioning operation. This threshold value is used as a criterion for determining from the use state of the component whether or not the function of the component deteriorates to such an extent as to affect the air-conditioning efficiency.

The data determination unit 13 reads out the information on the use state of the component from the air-conditioning data collected from the air-conditioning apparatuses A1 to A3, and determines whether a component the use state of which exceeds the threshold value is present or not. If the use state of a component exceeds the threshold value, the data determination unit 13 determines that the function of the component deteriorates, and if the use state of a component does not exceed the threshold value, the data determination unit 13 determines that the function of the component does not deteriorate. Then, if an indoor unit uses a component the function of which deteriorates, the data determination unit 13 causes the load on the indoor unit to be reduced, and causes another indoor unit to bear an amount of load by which the above load is reduced. To be more specific, during a cooling operation, the data determination unit 13 instructs the indoor unit using the component the function of which deteriorates to raise its target temperature set value by a predetermined value. During a heating operation, the data determination unit 13 instructs the air-conditioning apparatus using the component the function of which deteriorates, to lower its target temperature set value by a predetermined value.

Embodiment 2 is described above by referring to the case where whether or not the function of the component deteriorates is determined based on the time period of operation and time period of use, however, the criterion of the determination is not limited to the operation time period or the use period. For example, in the case where the filter 142 is the component to be monitored, whether or not the function of the component deteriorates may be determined in accordance with whether or not dirt is detected by the optical sensor.

If plural indoor units using components whose functions deteriorate are present, the data determination unit 13 may determine one of the plural indoor units which uses the largest number of components whose functions deteriorate, as a low-efficiency indoor unit.

Priorities may be assigned to plural components related to the air-conditioning operation in advance. In this case, if plural indoor units using components which deteriorate in function are present, the data determination unit 13 determines one of the plural indoor units which uses a component having the highest priority and deteriorating in function, as the low-efficiency indoor unit.

In addition, with respect to each of the plural components related to the air-conditioning operation, a weighting value corresponding to the degree of influence of each component on the air-conditioning efficiency may be determined in advance. In this case, if plural components which deteriorate in function are present, regarding each of indoor units, the data determination unit 13 finds the sum of the weighting values of the components deteriorating in function, and determines one of the indoor units which includes components which deteriorate in function and the weighting values of which are summed to be the greatest of those of all the indoor units, as the low-efficiency indoor unit.

(Method of Air-Conditioning Control to be Executed by Controller 1 in Embodiment 2)

Next, an operation to be performed by the controller 1 in the air-conditioning system according to embodiment 2 will be described.

If an air-conditioning apparatus is operated for a long time period, functions of components thereof deteriorate. For example, functions of the heat exchangers 141 and 152, the compressor 151 and the expansion valve 154 deteriorate, and a filter function of the filter 142 deteriorates due to dirt. If the air-conditioning apparatus continues to operate with the functions of the components deteriorated, the air-conditioning apparatus can no longer ensure the air-conditioning efficiency with which the performance of the air-conditioning apparatus can be achieved, and its air-conditioning efficiency lowers.

In order to prevent the operation from being continued with the air-conditioning efficiency lowered, it suffices to replace, when a component deteriorates in function, the component by a new one, and to change the lowered air-conditioning efficiency back to the air-conditioning efficiency not lowered. However, in the air-conditioning system as illustrated in FIG. 1, even when the operation device 2 displays the fact that a component deteriorates in function, in the case where the operation unit 2 is provided in the server room, there is a case where the administrator is not aware of deterioration of the function of the component, since in the server room, usually, no person is present. In this case, the operation of the air-conditioning apparatus is continued with the air-conditioning efficiency lowered. In embodiment 2, this problem is solved in the following manner.

Figure 5:
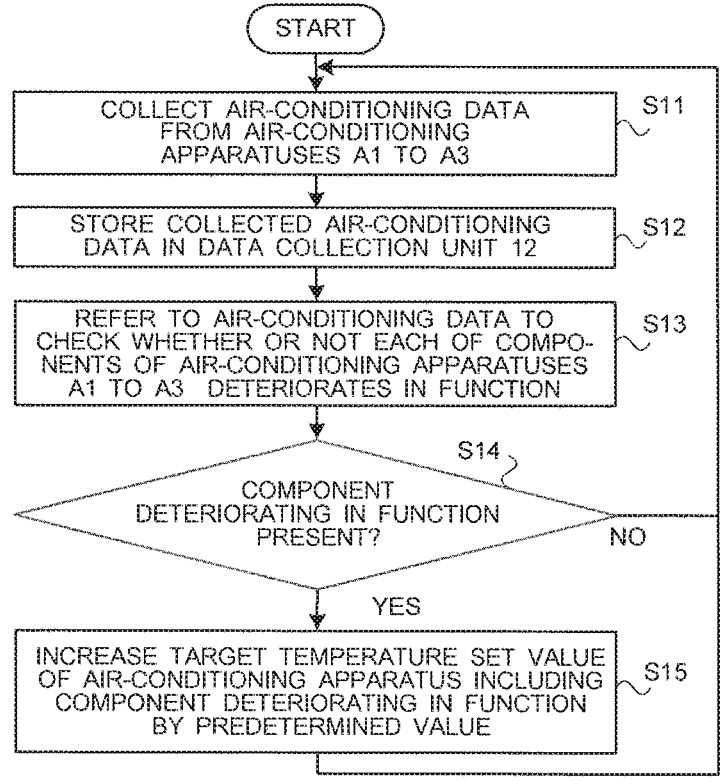
FIG. 5 is a flow chart of the procedure for an operation to be performed by the controller as illustrated in FIG. 1, in embodiment 2 of the present invention.

FIG. 5 is a flow chart of the procedure for the operation to be performed by the controller as illustrated in FIG. 1 in embodiment 2 of the present invention. It is assumed that the air-conditioning apparatuses A1 to A3 are performing a cooling operation.

The communication unit 11 collects air-conditioning data from each of the air-conditioning apparatuses A1 to A3 (step S11), and stores the collected air-conditioning data in the data collection unit 12 (step S12).

The data determination unit 13 reads information on the use state of each of components related to the air-conditioning operation from air-conditioning data held by the data collection unit 12, and compares the use state indicated by the read information with the threshold value (step S13). Then, the data determination unit 13 determines whether or not the use state reaches the threshold value, to thereby determine whether or not each of the components deteriorates in function (step S14).

As the result of determination in step S14, when it is determined that the use state of a component reaches the threshold value, the data determination unit 13 determines that the component deteriorates in function. In this case, it is assumed that a component of the air-conditioning apparatus A1 deteriorates in function. The air-conditioning efficiency of the air-conditioning apparatus A1 including the deteriorated component lowers, and the data determination unit 13 transmits an instruction signal for instructing the air-conditioning apparatus A1 to increase its target temperature set value by a predetermined value (step S15). The predetermined value is, for example, 1 (degree C.).

By contrast, as the result of determination in step S14, when it is determined that none of the use states of the components reaches the threshold value, from all the air-conditioning data, the data determination unit 13 returns to the process of step S11. Also, after carrying out step S15, the data determination unit 13 returns to the process of step S11.

With the above operation, the air-conditioning apparatus A1 having the air-conditioning efficiency which lowers due to the deterioration of the function of the component is switched to be in an operation state with a low load. By contrast, the target temperature set values of the air-conditioning apparatus A2 and A3, in which none of the components deteriorates in function, are not changed, but the loads on the air-conditioning apparatuses A2 and A3 are automatically increased, since the temperature of the room tends to be higher as a result of lowering of the load on the air-conditioning apparatus A1.

In such a manner, the operation of the air-conditioning apparatus A1, the air-conditioning efficiency of which is lowered because of deterioration of the function of a component, is changed to the operation with a low load, and the loads on the air-conditioning apparatus A2 and A3 are increased to compensate for lowering of the load on the air-conditioning apparatus A1. It is therefore possible to achieve air-conditioning with a higher air-conditioning efficiency as the entire system, and also achieve it even until the above component of the air-conditioning apparatus A1 is replaced by a new one.

In embodiment 2, the target temperature set values of the air-conditioning apparatus A2 and A3, in which none of the components deteriorates in function, are not changed; however, in order to compensate for lowering of the load on the air-conditioning apparatus A1, the target temperature set values of the air-conditioning apparatus A2 and A3 may be lowered so that the loads on the air-conditioning apparatus A2 and A3 are intentionally increased.

The air-conditioning system according to embodiment 2 includes the plural air-conditioning apparatus A1 to A3 and the controller 1 which includes the communication unit 11, the data collection unit 12 and the data determination unit 13. The air-conditioning apparatuses A1 to A3 transmit air-conditioning data including information indicating the use state of at least one component related to the air-conditioning operation to the controller 1 as information indicating the air-conditioning efficiency. The data determination unit 13 refers to the air-conditioning data on each of the air-conditioning apparatuses A1 to A3 to determine whether or not the least one component deteriorates in function based on information on the use state of the at least one component; determines one of the air-conditioning apparatuses which uses a component which deteriorates in function, as a low-efficiency air-conditioning apparatus, reduces the load on the low-efficiency air-conditioning apparatus, and causes one or ones of the air-conditioning apparatuses which are other than the low-frequency air-conditioning apparatuses to bear an amount of load by which the load on the lower-efficiency air-conditioning apparatus is reduced.

According to embodiment 2, if a component of an air-conditioning apparatus deteriorates in function, the air-conditioning efficiency of the air-conditioning apparatus lowers, and hence the load on the air-conditioning apparatus in which the component deteriorates in function is reduced, and thus an amount of load by which the above load is reduced is automatically compensated for by another air-conditioning apparatus. Accordingly, the load on the air-conditioning apparatus in which none of the components deteriorate in function is increased, and the air-conditioning efficiency of the entire air-conditioning system is improved, as a result of which energy saving can be achieved.

| Reference Signs List | | |
|---|---|---|
| 1 controller | 2 operation device | 3 communication line |
| 11 communication unit | 12 data collection unit | 13 data determination unit |
| 21 communication unit | 22 data collection unit | 23 data display unit |
| 24 operation unit | 141, 152 heat exchanger | 142 filter |
| 143, 153 fan | 145 temperature sensor | 151 compressor |
| 154 expansion valve | A1 to A3 air-conditioning apparatus | A11, A21, A31 communication unit |
| A12, A22, A32 air-conditioning data holding unit | A13, A23, A33 control unit | A14 indoor unit |
| A15 outdoor unit | A16 signal line | A17 refrigerant pipe |

The invention claimed is:

1. An air-conditioning system comprising:
plural air-conditioning apparatuses configured to air-condition the same space; and
a controller configured to
communicate with the plural air-conditioning apparatuses via a communication line;
collect air-conditioning data including information indicating an air-conditioning efficiency from each of the plural air-conditioning apparatuses via the communication line;
determine one of the plural air-conditioning apparatuses which has a lowest air-conditioning efficiency, as a low-efficiency air-conditioning apparatus, based on the collected air-conditioning data;
reduce a load on the low-efficiency air-conditioning apparatus; and
cause one or ones of the plural air-conditioning apparatuses, which are other than the low-efficiency air-conditioning apparatus, to bear an amount of load by which the load on the low-efficiency air-conditioning apparatus is reduced, wherein the controller is further configured to
cause at least one of the plural air-conditioning apparatuses, which is other than the low-efficiency air-conditioning apparatus, to bear the amount of load by transmitting an instruction signal to the at least one of the plural air-conditioning apparatuses to change a target temperature set value by a pre-determined value, and
reduce the load of the low-efficiency air-conditioning apparatus by transmitting an instruction signal to the low-efficiency air-conditioning apparatus to reduce the load by changing a target temperature set value in accordance with the pre-determined value.

2. The air-conditioning system of claim 1,
wherein the information indicating the air-conditioning efficiency includes a coefficient of performance, and
wherein the controller is further configured to: refer to the air-conditioning data on each of the plural air-conditioning apparatuses to determine one of the plural air-conditioning apparatuses which has a smallest value of the coefficient of performance, as the low-efficiency air-conditioning apparatus, and determine one of the plural air-conditioning apparatuses which has a greatest value of the coefficient of performance, as a high-efficiency air-conditioning apparatus; and cause the high-efficiency air-conditioning apparatus to bear the amount of load by which the load on the low-efficiency air-conditioning apparatus is reduced.

3. The air-conditioning system of claim 1,
wherein each of the plural air-conditioning apparatuses transmits the air-conditioning data to the controller, the air-conditioning data including information indicating a use state of at least one component related to an air-conditioning operation, and
wherein the controller is further configured to refer to the air-conditioning data transmitted by the each of the plural air-conditioning apparatuses, determine whether a function of the at least one component deteriorates or not, based on the information indicating the use state of the at least one component, and determine one of the plural air-conditioning apparatuses which uses a component whose function deteriorates, as the low-efficiency air-conditioning apparatus.

4. The air-conditioning system of claim 1, wherein the controller is further configured to transmit the instruction signal including information regarding changing of the target temperature set value, which is made in accordance with the amount of load by which the load on which the low-efficiency air-conditioning apparatus is reduced, to the low-efficiency air-conditioning apparatus via the communication line.

5. A method of an air-conditioning control, which is executed by a controller configured to control plural air-conditioning apparatuses configured to air-condition the same space, the method comprising:
collecting air-conditioning data including information indicating an air-conditioning efficiency from each of the plural air-conditioning apparatuses via a communication line;
determining one of the plural air-conditioning apparatuses which has a lowest air-conditioning efficiency, as a low-efficiency air-conditioning apparatus, based on the collected air-conditioning data;
reducing a load on the low-efficiency air-conditioning apparatus by transmitting an instruction signal to the low-efficiency air-conditioning apparatus to reduce the load by changing a target temperature set value in accordance with a pre-determined value; and
causing at least one of the plural air-conditioning apparatuses, which is other than the low-efficiency air-conditioning apparatus, to bear an amount of load by which the load on the Hall low-efficiency air-conditioning apparatus is reduced, by transmitting an instruction signal to the at least one of the plural air-conditioning apparatuses to change a target temperature set value by the pre-determined value.

6. A non-transitory computer readable medium storing a program to cause a computer configured to control plural air-conditioning apparatuses configured to air-condition the same space to execute the processes of:
collecting air-conditioning data including information indicating an air-conditioning efficiency from each of the plural air-conditioning apparatuses via a communication line;
determining one of the plural air-conditioning apparatuses which has a lowest air-conditioning efficiency, as a low-efficiency air-conditioning apparatus, based on the collected air-conditioning data;
reducing a load on the low-efficiency air-conditioning apparatus by transmitting an instruction signal to the low-efficiency air-conditioning apparatus to reduce the load by changing a target temperature set value in accordance with a pre-determined value; and
causing at least one of the plural air-conditioning apparatuses, which is other than the low-efficiency air-conditioning apparatus, to bear an amount of load by which the load on the low-efficiency air-conditioning apparatus is reduced, by transmitting an instruction signal to the at least one of the plural air-conditioning apparatuses to change a target temperature set value by the pre-determined value.

7. The method of claim 5,
wherein the information indicating the air-conditioning efficiency includes a coefficient of performance, and
further comprising: referring to the air-conditioning data on each of the plural air-conditioning apparatuses to determine one of the plural air-conditioning apparatuses which has a smallest value of the coefficient of performance, as the low-efficiency air-conditioning apparatus, and determining one of the plural air-conditioning apparatuses which has a greatest value of the coefficient of performance, as a high-efficiency air-conditioning apparatus; and causing the high-efficiency air-conditioning apparatus to bear the amount of load by which the load on the low-efficiency air-conditioning apparatus is reduced.

8. The method of claim 5,
wherein each of the plural air-conditioning apparatuses transmits the air-conditioning data to the controller, the air-conditioning data including information indicating a use state of at least one component related to an air-conditioning operation, and
further comprising: referring to the air-conditioning data transmitted by the each of the plural air-conditioning apparatuses, determining whether a function of the at least one component deteriorates or not, based on the information indicating the use state of the at least one component, and determining one of the plural air-conditioning apparatuses which uses a component whose function deteriorates, as the low-efficiency air-conditioning apparatus.

9. The method of claim 5, further comprising transmitting the instruction signal including information regarding changing of the target temperature set value, which is made in accordance with the amount of load by which the load on which the low-efficiency air-conditioning apparatus is reduced, to the low-efficiency air-conditioning apparatus via the communication line.

10. The non-transitory computer readable medium of claim 6,
wherein the information indicating the air-conditioning efficiency includes a coefficient of performance, and
further comprising: referring to the air-conditioning data on each of the plural air-conditioning apparatuses to determine one of the plural air-conditioning apparatuses which has a smallest value of the coefficient of performance, as the low-efficiency air-conditioning apparatus, and determining one of the plural air-conditioning apparatuses which has a greatest value of the coefficient of performance, as a high-efficiency air-conditioning apparatus; and causing the high-efficiency air-conditioning apparatus to bear the amount of load by which the load on the low-efficiency air-conditioning apparatus is reduced.

11. The non-transitory computer readable medium of claim 6,
wherein each of the plural air-conditioning apparatuses transmits the air-conditioning data to the controller, the air-conditioning data including information indicating a use state of at least one component related to an air-conditioning operation, and
further comprising: referring to the air-conditioning data transmitted by the each of the plural air-conditioning apparatuses, determining whether a function of the at least one component deteriorates or not, based on the information indicating the use state of the at least one component, and determining one of the plural air-conditioning apparatuses which uses a component whose function deteriorates, as the low-efficiency air-conditioning apparatus.

12. The non-transitory computer readable medium of claim 6, further comprising transmitting the instruction signal including information regarding changing of the target temperature set value, which is made in accordance with the amount of load by which the load on which the low-efficiency air-conditioning apparatus is reduced, to the low-efficiency air-conditioning apparatus via the communication line.

* * * * *